US011385734B2

(12) United States Patent
Gupta et al.

(10) Patent No.: US 11,385,734 B2
(45) Date of Patent: Jul. 12, 2022

(54) MULTI-PANEL DISPLAY DEVICE

(71) Applicant: Microsoft Technology Licensing, LLC, Redmond, WA (US)

(72) Inventors: Vasudha Gupta, Bothell, WA (US); Matthew D. Morris, Seattle, WA (US); Christopher Andrew Whitman, Fort Collins, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 81 days.

(21) Appl. No.: 16/909,890

(22) Filed: Jun. 23, 2020

(65) Prior Publication Data

US 2021/0397281 A1    Dec. 23, 2021

(51) Int. Cl.
*G06F 3/041*         (2006.01)
*G02F 1/1333*        (2006.01)
(Continued)

(52) U.S. Cl.
CPC ........ *G06F 3/0412* (2013.01); *G02F 1/13338* (2013.01); *G02F 1/13452* (2013.01);
(Continued)

(58) Field of Classification Search
CPC ............. G06F 3/0412; G02F 1/133391; G02F 1/13338; G02F 1/13452; G02F 1/13458;
(Continued)

(56) References Cited

U.S. PATENT DOCUMENTS 7,170,468 B2    1/2007  Knopf
7,184,015 B2    2/2007  Morita
(Continued)

FOREIGN PATENT DOCUMENTS

EP    1555648 A2    7/2005
EP    2720110 A2    4/2014
(Continued)

OTHER PUBLICATIONS

"International Search Report & Written Opinion issued in PCT Application No. PCT/US21/032119", dated Aug. 13, 2021, 14 Pages.
(Continued)

*Primary Examiner* — Hoan C Nguyen
(74) *Attorney, Agent, or Firm* — Alleman Hall Creasman & Tuttle LLP

(57) ABSTRACT

A display device includes a first display panel including N input/output (I/O) pads [$I/O_1$ to $I/O_N$] at a first side of the display device. A first display driver is operatively connected to the N I/O pads of the first display panel at the first side of the display device. A second display panel includes the N I/O pads at the first side of the display device. I/O pads $I/O_{1+M}$ and $I/O_{N-M}$ are a same type of I/O pad for M=0 to M=P for the first display panel and the second display panel. A second display driver, having a same configuration as the first display driver is operatively connected to the N I/O pads of the second display panel at the first side of the display device. A hinge pivotably connects the first display panel to the second display panel.

20 Claims, 9 Drawing Sheets

(51) Int. Cl.
*G02F 1/1345* (2006.01)
*G09G 3/20* (2006.01)
*G02F 1/1362* (2006.01)

(52) U.S. Cl.
CPC .... *G02F 1/13458* (2013.01); *G02F 1/133391* (2021.01); *G09G 3/20* (2013.01); *G02F 1/136286* (2013.01); *G06F 2203/04102* (2013.01); *G09G 2300/026* (2013.01); *G09G 2300/0426* (2013.01); *G09G 2310/0202* (2013.01); *G09G 2354/00* (2013.01)

(58) Field of Classification Search
CPC .... G02F 1/136286; G02F 2203/04102; G09G 3/20; G09G 2300/026; G09G 2300/0426; G09G 2310/0202; G09G 2354/00
See application file for complete search history.

(56) References Cited

U.S. PATENT DOCUMENTS

| | | | |
|---|---|---|---|
| 7,737,390 B2 | 6/2010 | Sarig et al. | |
| 8,384,615 B2 | 2/2013 | Tan et al. | |
| 8,456,602 B2 | 6/2013 | Fujikawa | |
| 8,502,275 B2 | 8/2013 | Chang | |
| 8,638,280 B2 | 1/2014 | Nonaka | |
| 8,730,422 B2 | 5/2014 | Park et al. | |
| 8,738,101 B1 | 5/2014 | Myr | |
| 8,823,619 B2 | 9/2014 | Asano | |
| 8,866,840 B2 | 10/2014 | Dahl et al. | |
| 10,089,054 B2 | 10/2018 | Jouin | |
| 2005/0088463 A1 | 4/2005 | Schilling | |
| 2016/0155391 A1* | 6/2016 | Takesue | G09G 3/3413 345/690 |
| 2016/0172428 A1 | 6/2016 | Song et al. | |
| 2017/0117342 A1* | 4/2017 | Kwon | H01L 51/5206 |
| 2018/0190233 A1* | 7/2018 | Jang | G09G 3/3677 |
| 2018/0321779 A1* | 11/2018 | Huang | G06F 3/0446 |
| 2019/0034147 A1 | 1/2019 | Koki et al. | |
| 2019/0064979 A1 | 2/2019 | Liu et al. | |
| 2019/0289717 A1* | 9/2019 | Yueh | H05K 3/368 |

FOREIGN PATENT DOCUMENTS

| | | | | | |
|---|---|---|---|---|---|
| GB | 2260844 A | * | 4/1993 | ......... | G06F 3/1423 |
| KR | 20080027715 A | * | 3/2008 | | |
| KR | 20120088971 A | * | 8/2012 | ......... | G02F 1/13336 |

OTHER PUBLICATIONS

"Microsoft unveils dual-screen folding Android smartphone", Retrieved from: https://www.dezeen.com/2019/10/04/microsoft-surface-duo-folding-phone/, Oct. 4, 2019, 14 Pages.

* cited by examiner

MULTI-PANEL DISPLAY DEVICE

BACKGROUND

Multi-panel display devices may be useful in a variety of different scenarios. For example, multiple software application windows may be visually presented on separate display panels at the same time. Multi-panel display devices may use a hinge to allow for the display panels to fold in different directions (e.g., inward/outwards). Such foldability allows multi-panel display devices to have a larger total display area relative to a similarly-portable single display device, while also allowing for smaller folded dimensions relative to a non-folding display device offering the same display area.

SUMMARY

A display device includes a first display panel including N input/output (I/O) pads [$I/O_1$ to $I/O_N$] at a first side of the display device. A first display driver is operatively connected to the N I/O pads of the first display panel at the first side of the display device. A second display panel includes the N I/O pads at the first side of the display device. I/O pads $I/O_{1+M}$ and $I/O_{N-M}$ are a same type of IO pad for M=0 to M=P for the first display panel and the second display panel. A second display driver, having a same configuration as the first display driver is operatively connected to the N I/O pads of the second display panel at the first side of the display device. A hinge pivotably connects the first display panel to the second display panel.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The present description is directed to a hinged, multi-panel display device that utilizes palindromic I/O pads. As used herein, the term "palindromic" means a sequence which when flipped or reversed has the same order. By employing the palindromic layout of the I/O pads, display panels may be connected via a hinge and identical display drivers may be connected to both display panels on the same side of the multi-panel display device. Such a configuration facilitates design flexibility that enables the multi-panel display device to have edge-to-edge display panels with a small form factor. Moreover, such design flexibility allows for standard placement of device components (e.g., low density regions for camera under display, antennas, fingerprint sensor). Furthermore, by employing a single, reflected, display panel design for both display panels of the multi-panel device, the cost, complexity, and duration of producing the display panels may be reduced relative to a multi-panel display device that includes display panels that require separate design. In particular, after one panel is designed, the design for the other panel may be obtained by reflecting the design about the hinge axis, as discussed in more detail below. In this way, the design time may be substantially reduced (e.g., by half). Also, employing the single, reflected, display panel provides several advantages when compared to using identical display panels. For example, if an identical display panel is used for the left and right display panels, the display driver will connect to one panel (e.g., left panel) on one side (e.g., bottom) of the device, but connect to the other panel (e.g., right panel) on the other side (e.g., top) of the device. Such an arrangement results in complicated connections between the display panels that span across the opposing sides of the device. Moreover, such an arrangement restricts available placement for other device components (e.g., antenna placement and camera location).

Figure 1A:
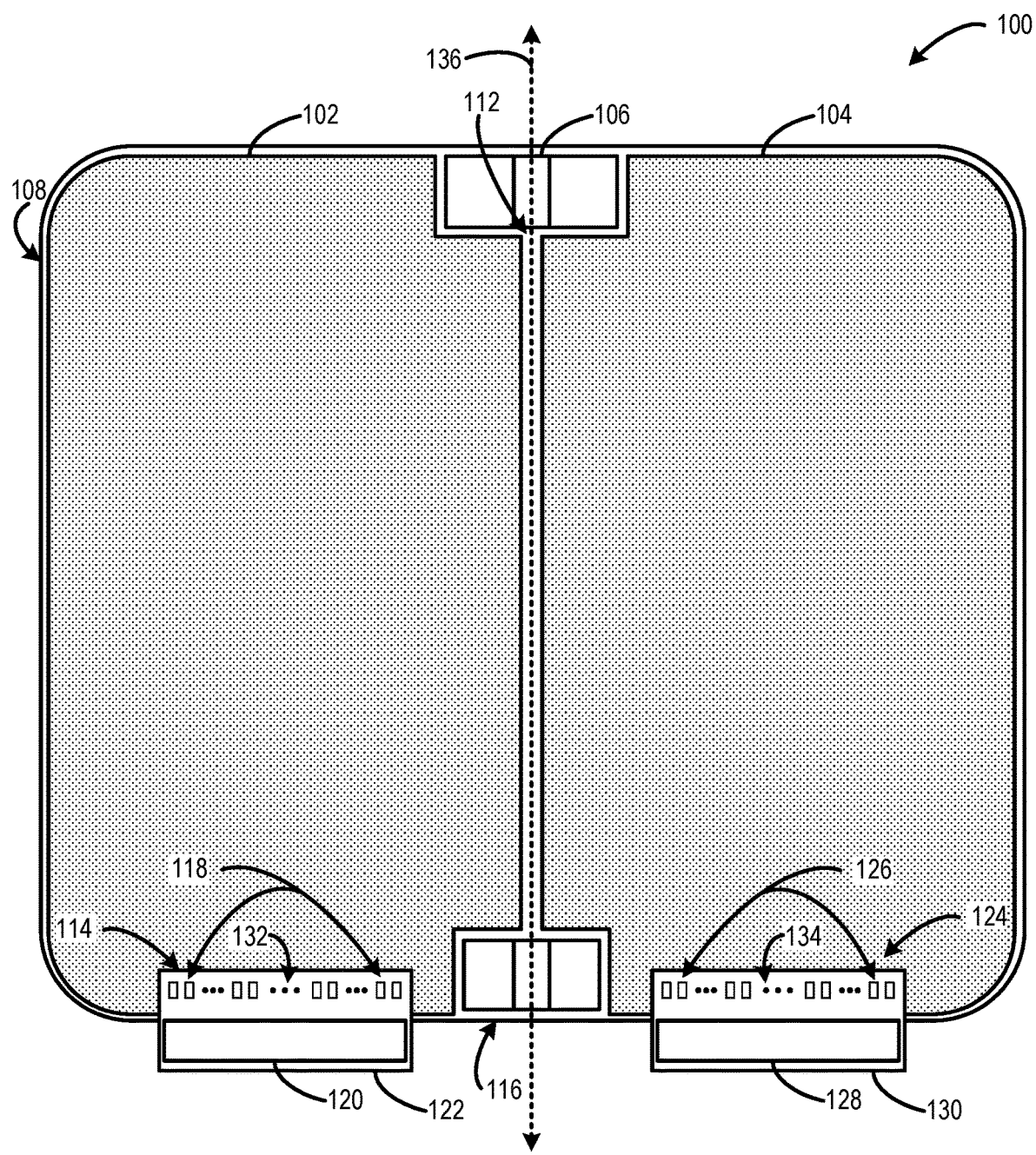
FIG. 1A shows an example multi-panel display device including a plurality of display panels.

FIG. 1A shows an example multi-panel display device 100 in simplified form. The multi-panel display device 100 is depicted as a mobile computing device that may be sized and shaped to be held by a user. The multi-panel display device 100 includes a first display panel 102 and a second display panel 104 pivotably connected via a hinge 106. The hinge 106 may be configured to allow the display panels 102, 104 to pivot to any suitable orientation relative to each other. In the illustrated example, the display panels 102, 104 are positioned side by side, such that the multi-panel display device 100 lies flat. As another example, the first display panel 102 may pivot to face the second display panel 104, such that the multi-panel display device 100 folds in half. The multi-panel display device 100 may be placed in this arrangement when the multi-panel display device 100 is not being used. As yet another example, the first display panel 102 may pivot to face away from the second display panel 104. In this arrangement, the multi-panel display device 100 may form an A-frame structure that allows the multi-panel display device 100 to stand up on its own without being held.

Each of the depicted display panels 102, 104 includes two rounded corners at each of outer edges 108, 110. Further, each display panel includes differently shaped corners containing cutouts in order to accommodate the hinge 106 at a spline edge 112. The display panels 102, 104 may be produced using the same design layout that is flipped between the first and second display panels. The use of a single design layout for both display panels is enabled by employing a palindromic I/O layout.

The first and second display panels 102, 104 may include any suitable display technology. Non-limiting examples of such display technologies include liquid crystal display (LCD), light emitting diode (LED), organic light emitting diode (OLED), and active-matrix organic light-emitting diode (AMOLED) display technologies.

The first display panel 102 includes a first set of I/O pads 114 at a bottom side 116 of the multi-panel display device 100. The first set of I/O pads 114 includes a first subset of palindromic I/O pads 118. A first display driver 120 is operatively connected to the first set of I/O pads 114 at the bottom side 116 of the multi-panel display device 100. The first display driver 120 is a control circuit (e.g., integrated circuit (IC)) that is configured to control display (and/or touch sensing) functionality of the first display panel 102. The first display driver 120 is mounted on a first flexible substrate (also referred to herein as a "flex") 122. The first flexible substrate 122 facilitates a flexible electrical connection between the first set of I/O pads 114 of the first display panel 102 and the first display driver 120, such that the first display driver 120 may be appropriately positioned within a small form factor of the multi-panel display device 100. The first display driver and the first flexible substrate 122 are schematically shown in front of the first display panel 102 to aid understanding. In practice, the first flexible substrate 122 may be bowed around the bottom edge of the first display panel 102, such that the first display driver 120 is positioned behind the first display panel 102 within the multi-panel display device 100.

The second display panel 104 is configured in the same manner as the first display panel 102. The second display panel 104 includes a second set of I/O pads 124 at the bottom side 116 of the multi-panel display device 100. The second set of I/O pads 124 includes a second subset of palindromic I/O pads 126. A second display driver 128 is operatively connected to the second set of I/O pads 124 at the bottom side 116 of the multi-panel display device 100. The second display driver 128 is a control circuit that is configured to control display (and/or touch sensing) functionality of the second display panel 104. The first display driver 120 and the second display driver 128 may have the same configuration. The second display driver 128 is mounted on a second flexible substrate 130. The second flexible substrate 130 facilitates a flexible electrical connection between the second set of I/O pads 124 of the second display panel 104 and the second display driver 128, such that the second display driver 128 may be appropriately positioned within a small form factor of the multi-panel display device 100. The second display driver 128 and the second flexible substrate 130 are schematically shown in front of the second display panel 104 to aid understanding. In practice, the second flexible substrate 130 may be bowed around the bottom edge of the second display panel 104, such that the second display driver 128 is positioned behind the second display panel 104 within the multi-panel display device 100.

Figure 1B:
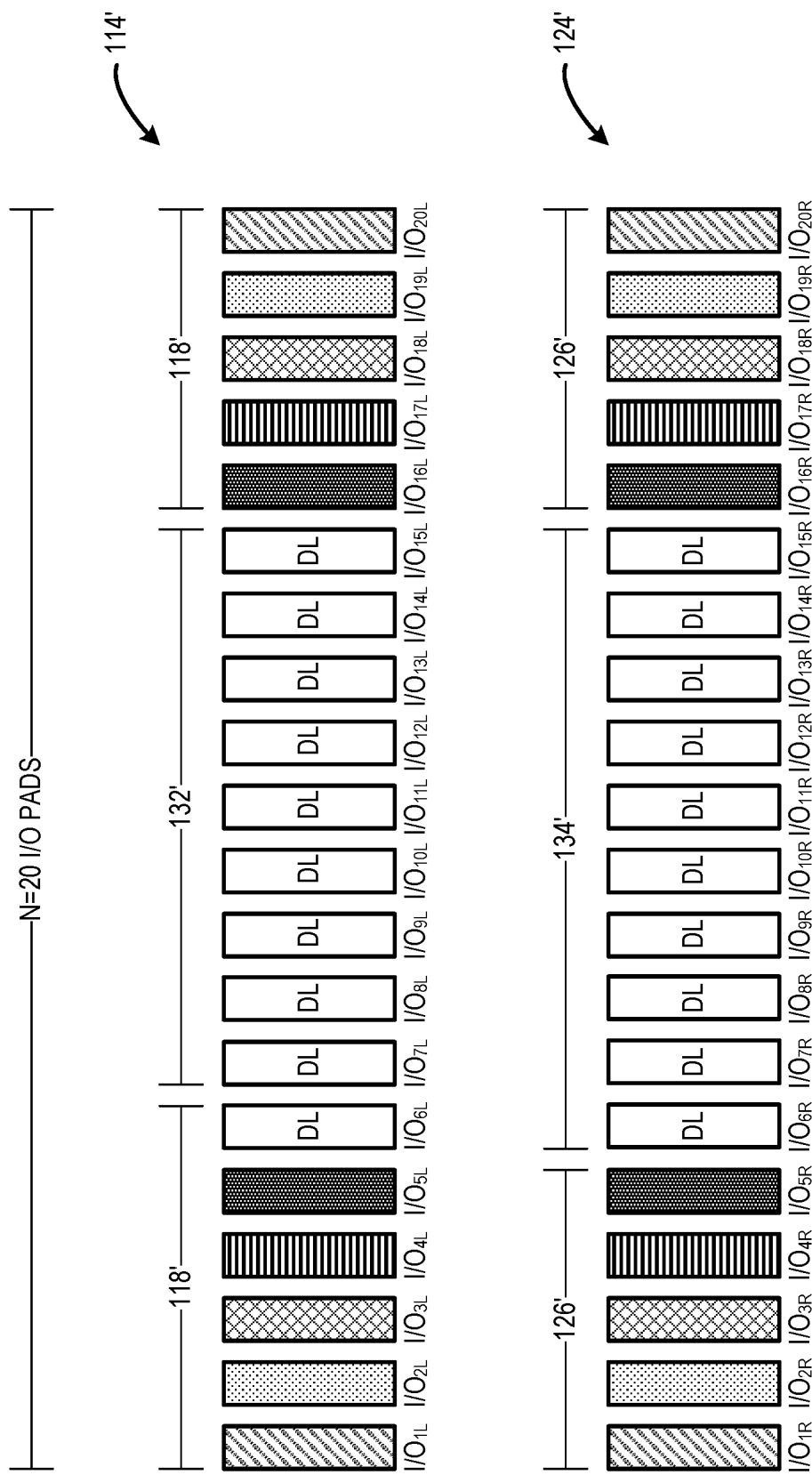
FIG. 1B shows an example I/O pad layout of the display panels of the multi-panel display device shown in FIG. 1A.

FIG. 1B shows a simplified I/O pad layout to ease understanding. FIG. 1B shows a first set of N=20 input/output (I/O) pads 114' labeled [$I/O_{1L}$ to $I/O_{NL}$] and a second set of the N=20 I/O pads 124' labeled [$I/O_{1R}$ to $I/O_{NR}$]. In the illustrated example, N=20 I/O pads for ease of understanding. In practice, the display panels may include any suitable number of I/O pads.

As illustrated, the first set of I/O pads 114' includes a first subset of palindromic I/O pads 118'. In particular, I/O pads $I/O_{1L}$ to $I/O_{5L}$ are palindromic with I/O pads $I/O_{16L}$ to $I/O_{20L}$. In other words, I/OIL is a same type of I/O pad as $I/O_{20L}$; $I/O_{2L}$ is a same type of I/O pad as $I/O_{19L}$; $I/O_{3L}$ is a same type of I/O pad as $I/O_{18L}$; $I/O_{4L}$ is a same type of I/O pad as $I/O_{17L}$; and $I/O_{5L}$ is a same type of I/O pad as $I/O_{16L}$. More generally, $I/O_{1+M}$ and $I/O_{N-M}$ are a same type of I/O pad for M=0 to M=P. In the illustrated example, P=4. P may be any suitable number of I/O pads, where P<=(N/2). In the case where P=(N/2), all I/O pads are palindromic I/O pads.

As illustrated, the second set of I/O pads 124' includes a second subset of palindromic I/O pads 126'. In particular, I/O pads $I/O_{1R}$ to $I/O_{5R}$ are palindromic with I/O pads $I/O_{16R}$ to $I/O_{20R}$. In other words, $I/O_{1R}$ is a same type of I/O pad as $I/O_{20R}$; $I/O_{2R}$ is a same type of I/O pad as $I/O_{19R}$; $I/O_{3R}$ is a same type of I/O pad as $I/O_{18R}$; $I/O_{4R}$ is a same type of I/O pad as $I/O_{17R}$; and $I/O_{5R}$ is a same type of I/O pad as $I/O_{16R}$.

Importantly, 114' and 124' utilize the same palindromic layout. As such, all of $I/O_{1L}$, $I/O_{20L}$, $I/O_{1R}$, and $I/O_{20R}$ are a same type of I/O pad; all of $I/O_{2L}$, $I/O_{19L}$, $I/O_{2R}$, and $I/O_{19R}$ are a same type of I/O pad; all of $I/O_{3L}$, $I/O_{18L}$, $I/O_{3R}$, and $I/O_{18R}$ are a same type of I/O pad; all of $I/O_{4L}$, $I/O_{17L}$, $I/O_{4R}$, and $I/O_{17R}$ are a same type of I/O pad; and all of $I/O_{5L}$, $I/O_{16L}$, $I/O_{5R}$ are a same type of I/O pad. As such, a display driver having the exact same configuration may be used on both I/O pads 114' and 124'.

Returning to FIG. 1A, the first and second set of palindromic I/O pads 118, 126 may include any suitable types of I/O pads configured to transmit any suitable signals between the display panels 102, 104 and the corresponding display drivers 120, 128. Non-limiting example types of I/O pads may include palindromic in-panel gate driver pads that are configured to control signals to drive pixels in an active area of the display panel; palindromic power line pads (e.g., VCOM for LCD, Cathode for OLED, DC power supplies, such as VGH, VGL, VEH, VEL for gate/emission drivers or other reference supplies for OLED pixel operation such as VREF or VINI); and palindromic gate/emission I/O signal pads (e.g., clock signals, start pulse signals for shift registers, reset signals, pre-charge signals, and monitor output signals).

Note that the physical layout of the individual I/O pads may be non-uniformly spaced apart and/or positioned to accommodate the shape and dimensions (e.g., the rounded corners, the notched corners) of the multi-panel display device 100, but the sequence of the sets of I/O pads 118, 126 may remain palindromic and/or the locations of the pads may have reflection axis symmetry so that the same display driver may be used for left and right display panels.

In some implementations, the first and second sets of I/O pads 114, 124 may include sets of I/O pads that are not arranged according to a palindromic sequence. For example, the first set of I/O pads may further include a first subset of data input lines 132 between the first subset of palindromic I/O pads 118. Likewise, the second set of I/O pads 124 may further include a second subset of data input lines 134 between the second subset of palindromic I/O pads 126. As shown in FIG. 1B, I/O pads $I/O_{1+P+1}$ to $I/O_{N-P-1}$ are data input lines for the first display panel and the second display panel. In the illustrated example where P=4, I/O pads $I/O_{1+4+1=6}$ through $I/O_{20-4-1=15}$ are data input line I/O pads that makeup the first and second subsets of data input lines 132', 134' in the first and second sets of I/O pads 114', 124'. The first and second sets of I/O pads 114', 124' may include any suitable number of data input lines. The number of data input lines may be equal to ((N/2)−P)×2.

Returning to FIG. 1A, the first and second subsets of data input lines 132, 134 may be configured to communicate color information for the pixels of the display panels 102, 104 according to a designated sequence. In some examples, the designated sequence of the data input lines may be configured for regular pixel rendering, such as an RGB or BGR sequence. In other examples, the designated sequence of the data input lines may be configured for sub-pixel rendering. It will be appreciated that the data input lines may be arranged according to any suitable sequence of color information. Additionally or alternatively, other types of I/O pads may be included in the subsets of non-palindromic I/O pads 132, 134. For example, in some implementations, data input lines might be driven through a multiplexer/demultiplexer, and the subsets of I/O pads 132, 134 may include one or more multiplexer/demultiplexer control signals.

In implementations where the display panels 102, 104 include a non-palindromic sequence of I/O pads corresponding to data input lines, one or more of the display drivers 120, 128 may be configured to reverse a sequence of data input lines operatively connected to the subset of data input lines 132 or 134 such that the input to both display panels match. For example, the first display driver 120 may receive a sequence VSS, VDD, VGL, VINI, VGH, CLK2, CLK1, ST, GOUT, EM_OUT, EST, ECLK1, ECLK2, S1, S2, S3, . . . , S1199, S1200, ECLK2, ECLK1, EST, EM_OUT, GOUT, ST, CLK1, CLK2, VGH, VINI, VGL, VDD, VSS. On the other hand, the second display driver 128 may receive the sequence VSS, VDD, VGL, VINI, VGH, CLK2, CLK1, ST, GOUT, EM_OUT, EST, ECLK1, ECLK2, S1200, S1199, . . . , S3, S2, S1, ECLK2, ECLK1, EST, EM_OUT, GOUT, ST, CLK1, CLK2, VGH, VINI, VGL, VDD, VSS, since the second display is flipped relative to the first display and the subset of data input lines 134 is not palindromic. In this case, the second display driver 128 reverses the display lines to be S1, S2, S3, . . . , S1199, S1200, so that both display panels 102, 104 receive the same sequence of information. In implementations where the display panels receive sub-pixel color information, one or more of the display drivers 120, 128 may be configured to reverse a sub-pixel sequence of data input lines operatively connected to the subset of data input lines in the same manner, such that both display panels 102, 104 receive the same sequence of sub-pixel color information. In some implementations, the first display driver 120 and the second display driver 128 have a same configuration and may pass signals according to the same sequence.

The multi-panel display device 100 is configured such that the first display panel 102 and the second display panel 104 have reflection symmetry about a reflection axis 136 that is parallel with the hinge 106 that runs vertically in between the two display panels. Correspondingly, the first subset of palindromic I/O pads 118 and the second subset of palindromic I/O pads 126 have reflection symmetry about the reflection axis 136. Such palindromic sequencing and reflection symmetry allow for the first and second display drivers 120, 128 to be positioned on the same bottom side 116 of the multi-panel display device 100, which reduces design complexity and a form factor relative to a display device where display drivers are positioned on opposite sides of the device. Furthermore, the same display driver may be used for both panels.

Figure 2:
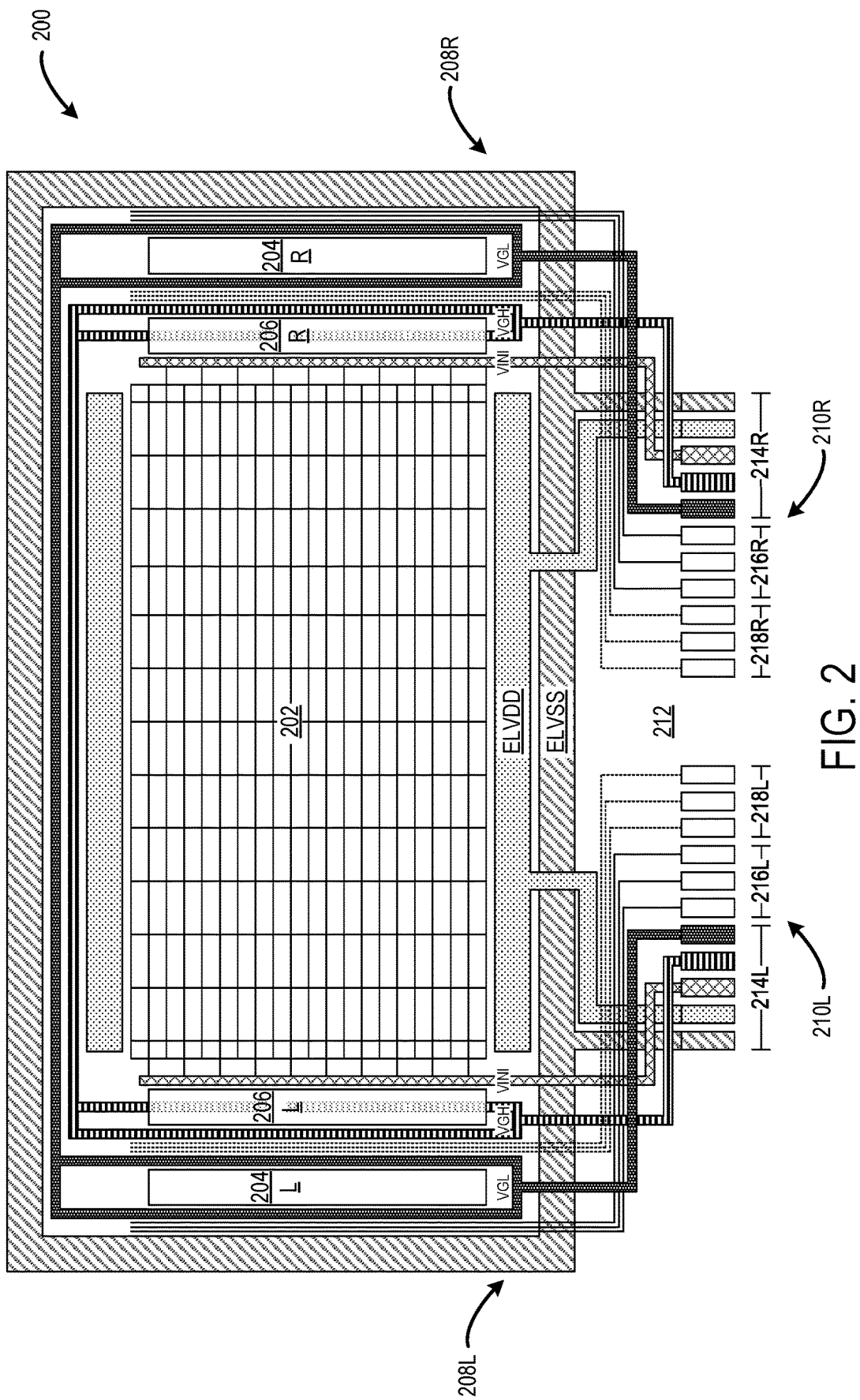
FIG. 2 shows an example I/O pad layout of a display panel.

FIG. 2 shows an example palindromic I/O pad layout of a display panel 200. For example, the display panel 200 may correspond to the first and second display panels 102, 104 shown in FIG. 1. The display panel 200 includes an active area 202 of pixels. The display panel 200 has a palindromic or mirror image architecture on each side of the active area 202. The pixels of the active area 202 are driven by in-panel gate drivers 204L and 204R positioned on each of the left and right sides of the active area 202. Output signal from the pixels of the active area 202 are received by emissions drivers 206L and 206R on each of the left and right sides of the active area 202. Additionally, a plurality of DC power supply lines 208L and 208R for powering the gate/emission drivers 204, 206 and/or other reference supplies are also routed vertically on each of the left and right sides of the active area 202. The power supply lines 208L, 208R, as well as the control signals for the emissions drivers 206L, 206R, and the control signals for the gate drivers 204L, 204R connect to a set of palindromic I/O pads 210L, 210R arranged in a palindromic sequence on a bottom side 212 of the display panel 200. A first subset of palindromic I/O pads 210L connect to the components on the left side of the active area 202. The first subset of palindromic I/O pads 210L includes a sequence of power line pads (e.g., ELVSS, ELVDD, VINI, VGH, VGL) 214L, in-panel gate driver pads (e.g., CLK2, CLK1, START) 216L, and gate/emission I/O signal pads (e.g., EM_ST, EM_CLK1, EM_CLK2) 218L. A second subset of palindromic I/O pads 210R connect to the components on the right side of the active area 202. The second subset of palindromic I/O pads mirror the first subset of palindromic I/O pads 210L. The second subset of palindromic I/O pads 210R includes a sequence of gate/emission I/O signal pads (e.g., EM_ST, EM_CLK1, EM_CLK2) 218L, in-panel gate driver pads (e.g., CLK2, CLK1, START) 216L, and power line pads (e.g., ELVSS, ELVDD, VINI, VGH, VGL) 214L.

By arranging the I/O pad layout of the display panel 200 according to a palindromic sequence, the display panel design may be used for both left and right side display panels of a multi-panel display device, while positioning I/O pads for both display panels on the same side of the multi-panel display device. Such a device layout allows for convenient device assembly and component flexibility without increasing cost or vendor effort of having to separately design different left and right display panels.

Figure 3:
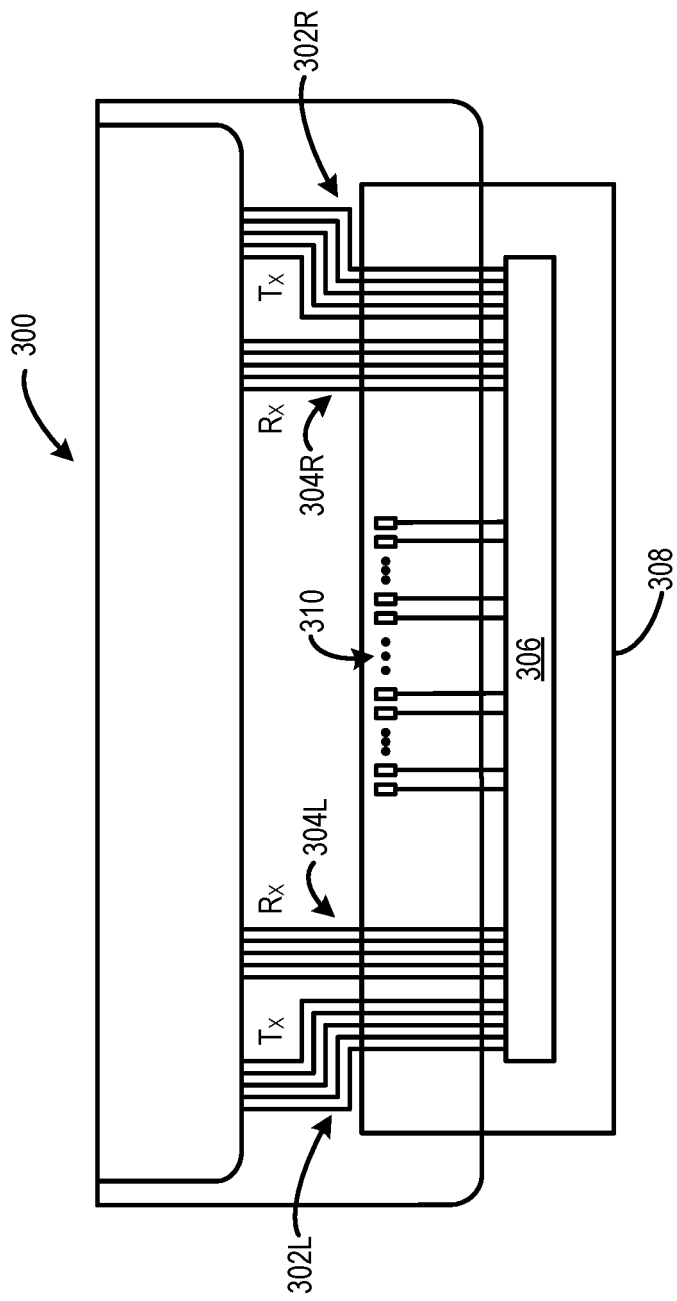
FIG. 3 shows an example display panel.

In some implementations, a display panel may be configured to provide touch sensing functionality in addition to display functionality. For example, such touch sensing functionality may be provided via touch sensors (e.g., receive electrodes (RX) and transmit electrodes (TX)) that are overlaid on top of an active area of the display panel. FIG. 3 shows an example touch-sensing display panel 300 including a symmetric layout of touch sensors. The display panel 300 includes a symmetric layout of touch transmit electrodes (Tx) 302L, 302R and a symmetric layout of touch receive electrodes (Rx) 304L, 304R. In particular, there is an equal number of touch transmit electrodes (TX) and touch receive electrodes (RX) on the left and right sides of the display panel 300. The touch transmit electrodes (Tx) 302L, 302R and the touch receive electrodes (Rx) 304L, 304R connect to a display driver 306 mounted on a flexible substrate 308. Additionally, a set of I/O pads 310 is located between the symmetric layout of the touch transmit electrodes (TX) 302L, 302R and the symmetric layout of the touch receive electrodes (RX) 304L, 304R. The set of I/O pads 310 may include a subset of palindromic I/O pads (e.g., gate/emission I/O signal pads, in-panel gate driver pads, and/or power line pads), a subset of data lines, or both.

In one example where the display panel 300 includes 10 horizontal touch transmit electrodes (e.g., T1-T10) and 8 vertical touch receive electrodes (e.g., R1-R8), the symmetric trace layout is arranged on the display panel from left to right as a first subset of touch transmit and receive electrodes T1, T2, T3, T4, T5, R1, R2, R3, R4. A set of I/O pads (e.g., 310 shown in FIG. 3) may be positioned on the display panel to the right of the first subset of touch transmit and receive electrodes. A second subset of touch transmit and receive electrodes may be positioned on the display panel to the right of the set of I/O pads and may be arranged from left to right as R5, R6, R7, R8, T6, T7, T8, T9, T10. In other words, the first and second subsets of touch electrodes are symmetric. The set of I/O pads is positioned in between the first and second subsets of touch electrodes. Correspondingly, an opposing display panel may have a mirror image of the symmetric trace layout arranged as T10, T9, T8, T7, T6, R8, R7, R6, R5, and then a set of I/O pads (e.g., 310 shown in FIG. 3), and then R4, R3, R2, R1, T5, T4, T3, T2, T1. These laterally inverted signal traces may connect to the same I/O pads on the display panel. In this way, the same driver circuits can be used for a left touch-sensing display panel and a right touch-sensing display panel.

Figure 4:
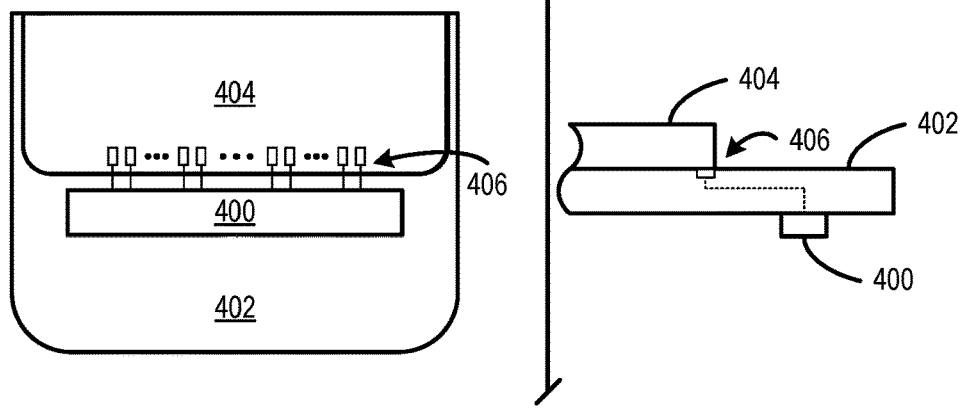
FIG. 4 shows an example chip-on-glass (COG) display panel configuration.
Figure 5:
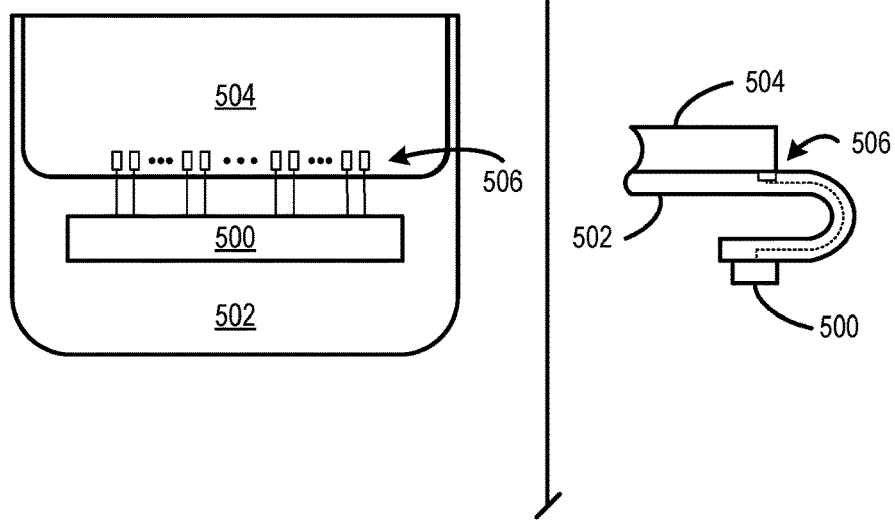
FIG. 5 shows an example chip-on-flex (COF) display panel configuration.
Figure 6:
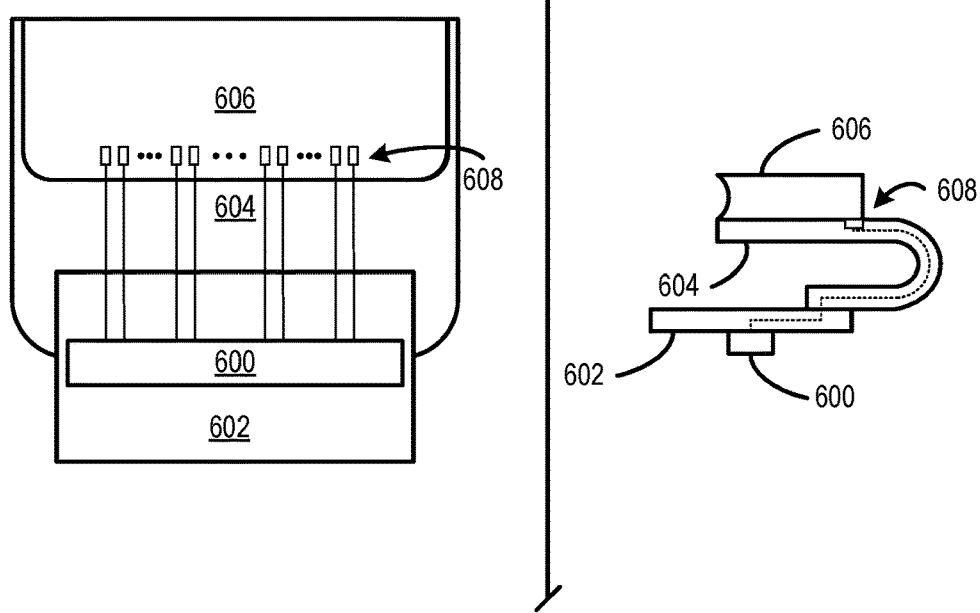
FIG. 6 shows an example chip-on-plastic (COP) display panel configuration.

A display driver may be electrically connected to a set of palindromic I/O pads of a display panel using different design technologies. FIGS. 4-6 show various examples of such different connections between a display driver and a set of palindromic I/O pads of a display panel. FIG. 4 shows a chip on glass (COG) display driver 400. The COG display driver 400 is mounted directly to a glass substrate 402 on which a display panel 404 is also mounted. The COG display driver 400 is operatively connected to a plurality of palindromic I/O pads 406 of the display panel 404 through the glass substrate 402. In some examples, the COG display driver 400 may be configured to reverse a sequence of outputs (or inputs to the display panel 404) that is not palindromic, such as a sequence of data input lines. In this way, one configuration of COG display driver 400 can be used for mirrored left and right display panels of a multi-panel display device.

FIG. 5 shows an example chip on plastic (COP) display driver 500. The COP display driver 500 is mounted directly to a flexible plastic substrate 502. A display panel 504 is also mounted to the flexible plastic substrate 502, such that the flexible plastic substrate 502 acts as a backplate for the display panel 504. The flexible nature of the plastic substrate 502 allows for the plastic substrate 502 to be folded over on itself such that the COP display driver 500 can be positioned underneath/behind the display panel 504. Such a COP configuration can provide narrow borders for an edge to edge full screen experience of a multi-panel display device by bending the plastic substrate 502 behind the display panel 504. The COP display driver 500 is operatively connected to a plurality of palindromic I/O pads 506 of the display panel 504 through the plastic substrate 502. In some examples, the COP display driver 500 may be configured to reverse a sequence of outputs (or inputs to the display panel 504) that is not palindromic, such as a sequence of data input lines. In this way, one configuration of COP display driver 500 can be used for mirrored left and right display panels of a multi-panel display device.

FIG. 6 shows an example chip on flex (COF) display driver 600. The COF display driver 600 is mounted to a flexible substrate 602 that is mounted to a flexible plastic substrate 604. A display panel 606 is also mounted to the flexible plastic substrate 604, such that the flexible plastic substrate 604 acts as a backplate for the display panel 606. The flexible nature of the plastic substrate 604 allows for the plastic substrate 604 to be folded over on itself such that the COF display driver 600 can be positioned underneath/behind the display panel 606. Such a COF configuration can provide narrow borders for edge to edge full screen experience of a multi-panel display device by bending the plastic substrate 604 behind the display panel 606. The COF display driver 600 is operatively connected to a plurality of palindromic I/O pads 608 of the display panel 606 through the plastic substrate 604 and the flexible substrate 602. In some examples, the COF display driver 600 may be configured to reverse a sequence of outputs (or inputs to the display panel 606) that is not palindromic, such as a sequence of data input lines. In other examples, where the display driver is not capable of reversing outputs, the flexible substrate 602 may be flipped around and mounted to the plastic substrate 604 to reverse the order of the non-palindromic inputs. Either way, one configuration of COF display driver 500 can be used for mirrored left and right display panels of a multi-panel display device.

Figure 7:
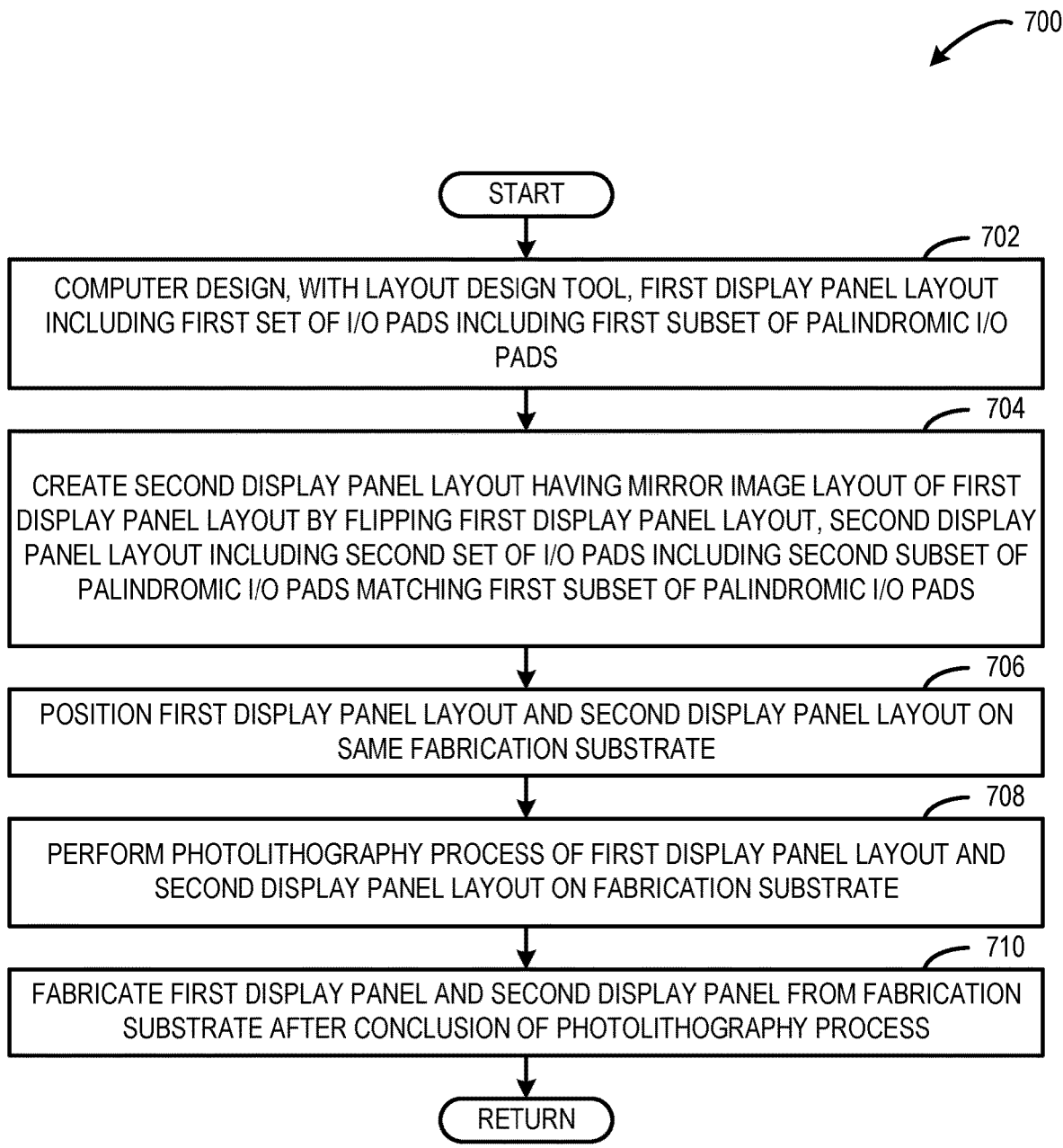
FIG. 7 shows an example method of fabricating a plurality of display panels.

FIG. 7 shows an example method 700 of fabricating a plurality of display panels each having a palindromic I/O pad layout. For example, the method 700 may be performed to fabricate the display panels 102, 104 of the multi-panel display device 100 shown in FIG. 1, the display panel 200 shown in FIG. 2, the display panel 300 shown in FIG. 3, or generally any mirrored display panels of a multi-panel display device. At 702, method 700 includes computer designing a first display panel layout including a first set of I/O pads with a layout design tool (e.g., computer aided design (CAD) program). The first set of I/O pads includes a first subset of palindromic I/O pads.

At 704, method 700 includes creating a second display panel layout having a mirror image layout of the first display panel layout by flipping the first display panel layout. For example, the first display panel design may be flipped along a side parallel to gate drivers of an active area of the first display panel to crate the second display panel layout having the mirror image layout. The second display panel layout includes a second set of I/O pads. The second set of I/O pads includes a second subset of palindromic I/O pads matching the first subset of palindromic I/O pads. Additionally, these mirror image display panel layouts may have various features that are mirrored between the two display panel layouts (e.g., locations of any rounded corners, notches, holes, low density regions for camera under display, cuts, antennas or finger print sensor built into panel layout).

At 706, method 700 includes positioning the first display panel layout and the second display panel layout on a same fabrication substrate (e.g., mother glass). At 708, the method 700 includes performing a photolithography process of the first display panel layout and the second display panel layout on the fabrication substrate. In some examples, the first and second display panel layouts may be positioned on the fabrication substrate, such that both the first and second display panel layouts are incorporated into a same mask shot of photolithography process. Further, in some examples, the first and second display panel layouts may be positioned on the fabrication substrate, such that an equal number of instances of the first and second display panel layouts are positioned in the same mask shot of the photolithography process.

Figure 8:
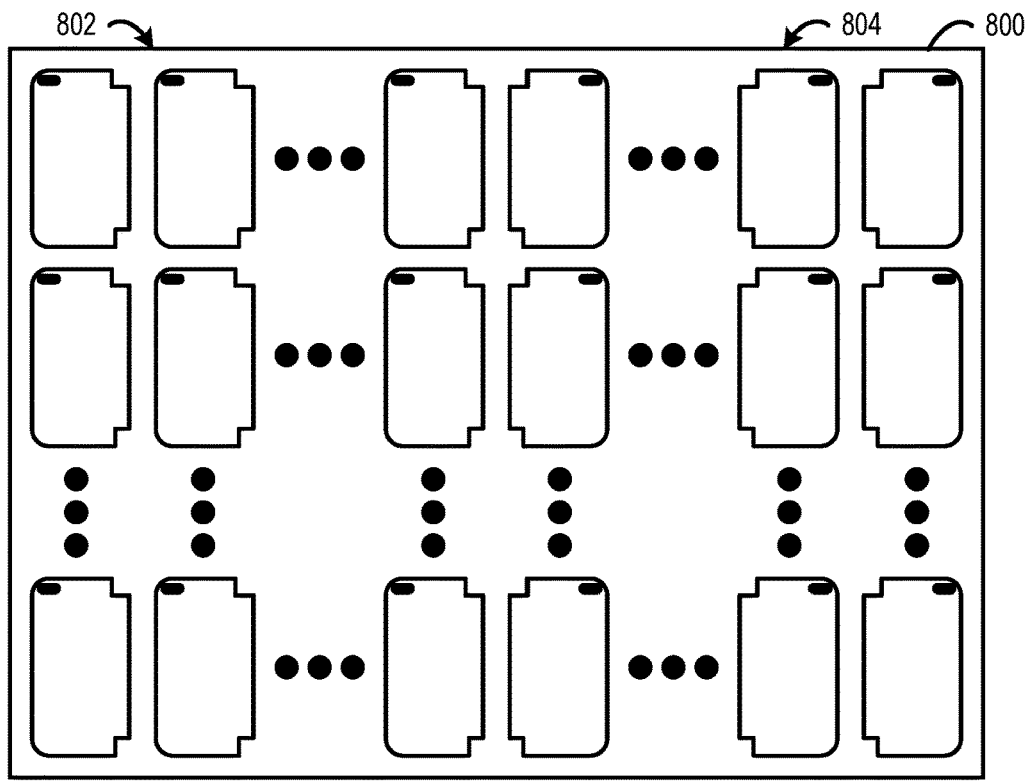
FIGS. 8 and 9 show different example layouts of display panels on fabrication substrates during a photo lithography fabrication process.
Figure 9:
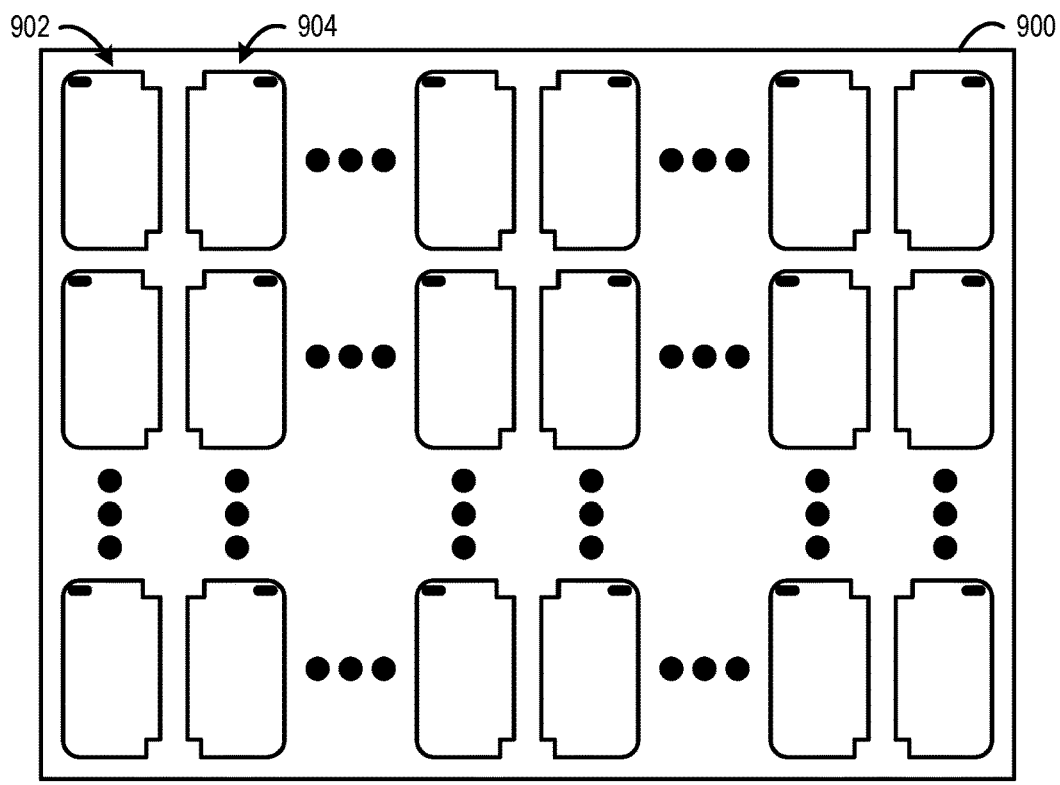

FIGS. 8 and 9 show different example display panel layout arrangements that may be used in the photolithography process described above. FIG. 8 shows an example fabrication substrate 800. A plurality of instances of a first panel display layout 802 (e.g., for a left panel) are positioned on a left side of the fabrication substrate 800. A plurality of instances of a second display panel layout 804 (e.g., for a right display panel) that mirrors the first display panel layout are positioned on a right side of the fabrication substrate 800. In this example, the same display panel layouts are all grouped together on the fabrication substrate 800.

FIG. 9 shows an example fabrication substrate 900 including matched pairs of first and second display panel layouts 902, 904 that are grouped together across the fabrication substrate 900. In other words, a first location of the first display panel layout 902 on the fabrication substrate 900 is immediately adjacent a second location of the second display panel layout 904 on the fabrication substrate 900 during photo lithography of the first display panel and the second display panel. Each pair of first and second display panel layouts 902, 904 are mirror images of each other and include matching subsets of palindromic I/O pads. Each matched pair of display panel layouts produce display panels that can be used together in the same multi-panel display device. Due to proximity of the matched pairs of display panels, such display panels may beneficially have matching optical performance. FIGS. 8 and 9 are provided as non-limiting examples. The first and second display panel layout may be arranged on a fabrication substrate in any suitable manner during a photolithography process.

Returning to FIG. 7, at 710, method 700 includes fabricating the first display panel and the second display panel from the fabrication substrate after conclusion of the photolithography process.

By making the I/O pad sequence palindromic on the display panel layout, mirror images of a single display panel layout may be used to fabricate two different display panels (e.g., a left display panel and a right display panel) of a multi-panel display device in a manner that reduces fabrication time and cost relative to an approach where two different display panel layouts are separately designed and fabricated.

Figure 10:
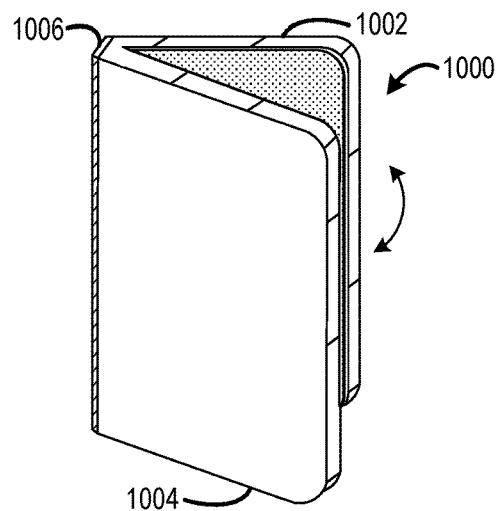
FIGS. 10-14 show different example hinged, multi-panel display devices.

The concepts relating to palindromic I/O pad layouts for display panels may be broadly applicable to differently configured multi-panel display devices. FIGS. 10-14 show different multi-panel display devices including a plurality of display panels that employ palindromic I/O pad layouts. FIG. 10 shows a multi-panel display device 1000 including a first display panel 1002 and a second display panel 1004 (shown facing inward toward the first display panel 1002) that are connected via a hinge 1006. The first and second display panels 1002, 1004 each includes a set of I/O pads including a subset of palindromic I/O pads, such that the first and second display panels 1002, 1004 are mirror image layouts of each other. The multi-panel display device 1000 is configured to fold inward such that the first and second display panels face each other. The hinge 1006 may allow for any suitable pivot range between the two display panels. In one example, the display panels 1002, 1004 may be pivoted between 0 and ~ 140 degrees, and the multi-panel display device 1000 may mimic the functionality of a laptop computer with one display panel presenting a virtual keyboard and the other display panel presenting a graphical user interface. In another example, the display panels 1002, 1004 may be pivoted, such that the multi-panel display device 1000 lays flat (i.e., 180 degrees). As one example, in this arrangement, the display panels may cooperate to present content that spans across both display panels. As another example, each panel may present different content, such as different software application windows.

Figure 11:
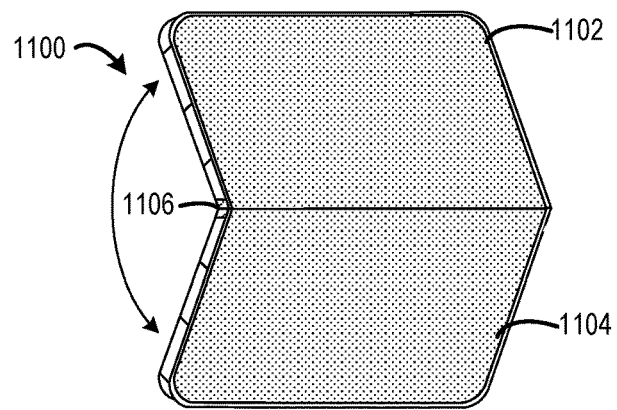

FIG. 11 shows a multi-panel display device 1100 including a first display panel 1102 and a second display panel 1104 that are connected via a hinge 1106. The first and second display panels 1102, 1104 each includes a set of I/O pads including a subset of palindromic I/O pads, such that the first and second display panels 1102, 1104 are mirror image layouts of each other. The multi-panel display device 1100 is configured to fold outward such that the first and second display panels 1102, 1104 face outward away from each other. As one example, the multi-panel display device 1100 may be folded such that first and second display panels 1102, 1104 oppose each other facing in opposite directions. The hinge 1106 may allow for any suitable pivot range between the two display panels.

Figure 12:
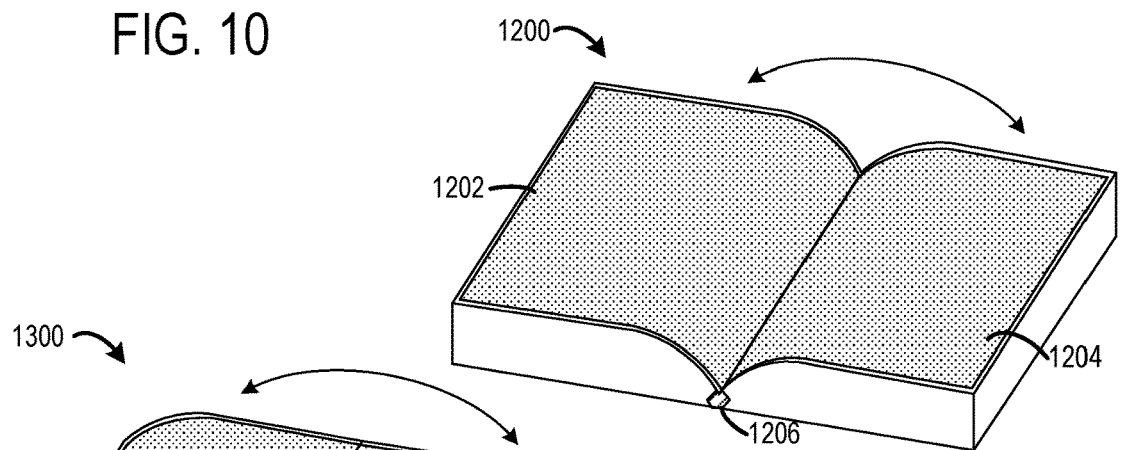

FIG. 12 shows a multi-panel display device 1200 including a first wraparound display panel 1202 and a second wraparound display panel 1204 that are connected via a hinge 1206. The first and second display panels 1202, 1204 each includes a set of I/O pads including a subset of palindromic I/O pads, such that the first and second display panels 1202, 1204 are mirror image layouts of each other. The first wraparound display panel 1202 includes a wraparound edge proximate the hinge 1206. Likewise, the second wraparound display panel 1204 includes a wraparound edge proximate the hinge 1206. In other words, the two wraparound edges oppose each other along a spline side of the wraparound display panels. For example, such wraparound edges may be configured to act as notification displays along the spline edge of the multi-panel display device 1200.

Figure 13:
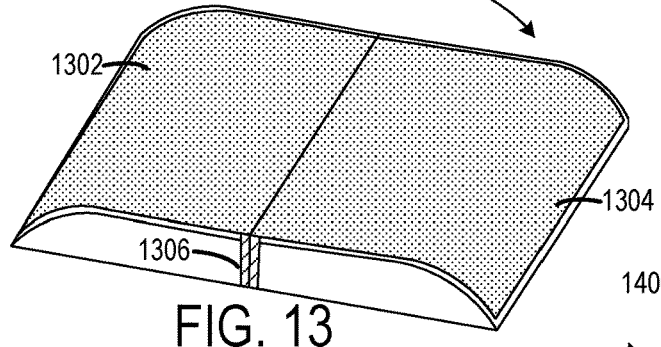

FIG. 13 shows a multi-panel display device 1300 including a first wraparound display panel 1302 and a second wraparound display panel 1304 that are connected via a hinge 1306. The first and second display panels 1302, 1304 each includes a set of I/O pads including a subset of palindromic I/O pads, such that the first and second display panels 1302, 1304 are mirror image layouts of each other. The first wraparound display panel 1302 includes a wraparound edge distal the hinge 1306. Likewise, the second wraparound display panel 1304 includes a wraparound edge distal the hinge 1306. In other words, the two wraparound edges are provided at opposite edges of the multi-panel display device 1300. For example, such wraparound edges may be configured to act as notification displays along the outer edges of the multi-panel display device 1300.

Figure 14:
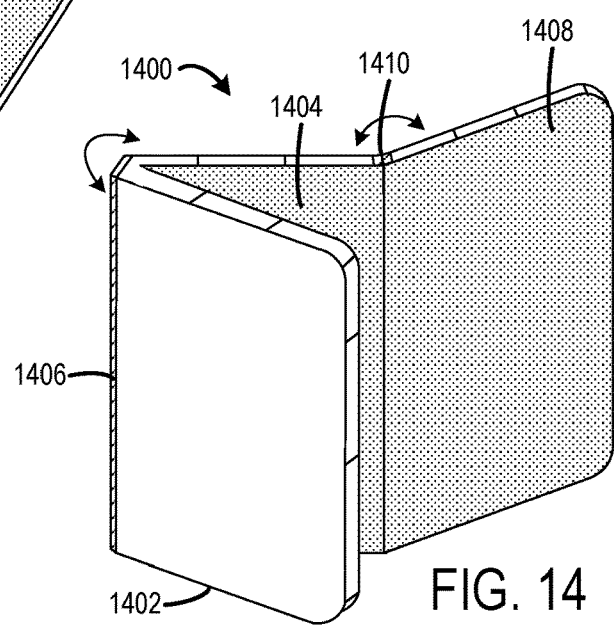

FIG. 14 shows a multi-panel display device 1400 including three display panels. A first display panel 1402 is connected to a second display panel 1404 via a first hinge 1406. The second display panel 1404 is connected to a third display panel 1408 via a second hinge 1410. The first display panel 1402 and the third display panel 1408 each includes a set of I/O pads including a subset of palindromic I/O pads, such that the first and third display panels 1402, 1408 are mirror image layouts of each other. The second display panel 1404 may be differently configured than the first and third display panels 1402, 1408. The first and third display panels 1402, 1408 may pivot in any suitable pivot range relative to the second display panel 1404, via the first and second hinges 1406, 1410. As one example, the first and third display panels 1402, 1408 may pivot such that the multi-panel display device 1400 lies flat with the first and third display panels positioned adjacent the second display panel 1404. As another example, the first and third display panels 1402, 1408 may pivot, such that the three display panels are stacked on top of each other in order to reduce an overall form factor of the multi-panel display device 1400.

Figure 15:
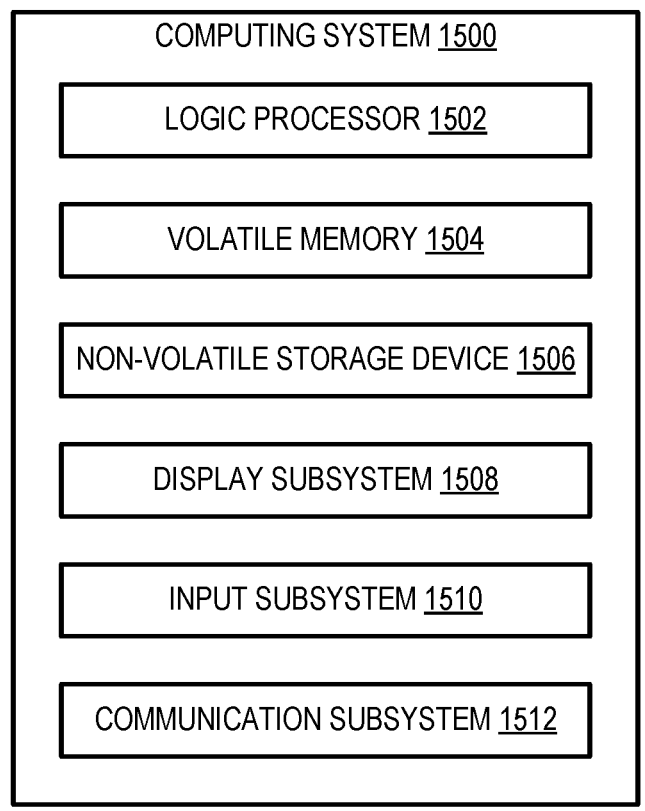
FIG. 15 shows an example computing system.

FIG. 15 schematically shows a non-limiting implementation of a computing system 1500 in simplified form. Computing system 1500 may embody any of the multi-panel display devices shown in FIGS. 1-6 and 10-14. Computing system 1500 may take the form of one or more multi-panel display devices, personal computers, laptop computers, server computers, tablet computers, home-entertainment computers, network computing devices, gaming devices, mobile computing devices, mobile communication devices (e.g., smart phone), wearable computing devices, head-mounted augmented/mixed virtual reality devices, and/or other computing devices.

Computing system 1500 includes a logic processor 1502, volatile memory 1504, and a non-volatile storage device 1506. Computing system 1500 may optionally include a display subsystem 1508, input subsystem 1510, communication subsystem 1512, and/or other components not shown in FIG. 15.

Logic processor 1502 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 1502 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 1506 includes one or more physical devices configured to hold instructions executable by the logic processors to implement the methods and processes described herein. When such methods and processes are implemented, the state of non-volatile storage device 1506 may be transformed—e.g., to hold different data.

Non-volatile storage device 1506 may include physical devices that are removable and/or built-in. Non-volatile storage device 1506 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 1506 may include nonvolatile, dynamic, static, read/write, read-only, sequential-access, location-addressable, file-addressable, and/or content-addressable devices. It will be appreciated that non-volatile storage device 1506 is configured to hold instructions even when power is cut to the non-volatile storage device 1506.

Volatile memory 1504 may include physical devices that include random access memory. Volatile memory 1504 is typically utilized by logic processor 1502 to temporarily store information during processing of software instructions. It will be appreciated that volatile memory 1504 typically does not continue to store instructions when power is cut to the volatile memory 1504.

Aspects of logic processor 1502, volatile memory 1504, and non-volatile storage device 1506 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1508 may be used to present a visual representation of data held by non-volatile storage device 1506. The visual representation may take the form of a graphical user interface (GUI). As the herein described methods and processes change the data held by the non-volatile storage device, and thus transform the state of the non-volatile storage device, the state of display subsystem 1508 may likewise be transformed to visually represent changes in the underlying data. Display subsystem 1508 may include one or more display devices utilizing virtually any type of technology. Such display devices may be combined with logic processor 1502, volatile memory 1504, and/or non-volatile storage device 1506 in a shared enclosure, or such display devices may be peripheral display devices.

When included, input subsystem 1510 may comprise or interface with one or more user-input devices such as a keyboard, mouse, touch screen, or game controller. In some implementations, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 1512 may be configured to communicatively couple various computing devices described herein with each other, and with other devices. Communication subsystem 1512 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some implementations, the communication subsystem may allow computing system 1500 to send and/or receive messages to and/or from other devices via a network such as the Internet.

In an example, a display device, comprises a first display panel including N input/output (I/O) pads [I/O$_1$ to I/O$_N$] at a first side of the display device, a first chip-on-flex display driver operatively connected to the N I/O pads of the first display panel at the first side of the display device, a second display panel including the N I/O pads at the first side of the display device, I/O$_{1+M}$ and I/O$_{N-M}$ are a same type of I/O pad for M=0 to M=P for the first display panel and the second display panel, a second chip-on-flex display driver, having a same configuration as the first chip-on-flex display driver, operatively connected to the N I/O pads of the second display panel at the first side of the display device, a hinge pivotably connecting the first display panel to the second display panel, the first display panel and the second display panel have reflection symmetry about a reflection axis parallel with the hinge. In this example and/or other examples, IO$_{1+P+1}$ to I/O$_{N-P-1}$ may be data input lines for the first display panel and the second display panel In this example and/or other examples, the first display panel and the second display panel may further include symmetric layouts of touch transmit electrodes (Tx) and symmetric layouts of touch receive electrodes (Rx). In this example and/or other examples, the N I/O pads may be located between the symmetric layout of Tx and Rx for the first display panel and the second display panel.

In another example, a display device, comprises a first display panel including a first set of input/output (I/O) pads at a first side of the display device, the first set of I/O pads including a first subset of palindromic I/O pads, a first display driver operatively connected to the first set of I/O pads at the first side of the display device, a second display panel including a second set of I/O pads at the first side of the display device, the second set of I/O pads including a second subset of palindromic I/O pads matching the first subset of palindromic I/O pads, a second display driver operatively connected to the second set of I/O pads at the first side of the display device, and a hinge pivotably connecting the first display panel to the second display panel. In this example and/or other examples, the first display panel and the second display panel may have reflection symmetry about a reflection axis parallel with the hinge such that the first subset of palindromic I/O pads and the second subset of palindromic I/O pads have reflection symmetry about the reflection axis. In this example and/or other examples, the first display driver and the second display driver may have a same configuration. In this example and/or other examples, the first set of I/O pads may further include a first subset of data input lines between the first subset of palindromic I/O pads, and the second set of I/O pads may further include a second subset of data input lines between the second subset of palindromic I/O pads. In this example and/or other examples, the first display driver may be configured to reverse a sequence of data input lines operatively connected to the first subset of data input lines. In this example and/or other examples, the first display driver may be configured to reverse a sub-pixel sequence of data input lines operatively connected to the first subset of data input lines. In this example and/or other examples, the first display driver may be a chip on flex (COF) display driver. In this example and/or other examples, the first display driver may be a chip on plastic (COP) display driver. In this example and/or other examples, the first subset of palindromic I/O pads may include palindromic in-panel gate driver pads, palindromic power line pads, and palindromic gate/emission I/O signal pads. In this example and/or other examples, the first display panel may further include a symmetric layout of touch transmit electrodes (Tx) and a symmetric layout of touch receive electrodes (Rx). In this example and/or other examples, the first subset of palindromic I/O pads may be located between the symmetric layout of Tx and Rx. In this example and/or other examples, the first display panel may include a wraparound edge distal the hinge, and the second display panel may include a wraparound edge distal the hinge. In this example and/or other examples, the first display panel may include a wraparound edge proximate the hinge, and the second display panel may include a wraparound edge proximate the hinge. In this example and/or other examples, the first display panel and the second display panel may be on a same fabrication substrate during photo lithography of the first display panel and the second display panel. In this example and/or other examples, a first location of the first display panel on the fabrication substrate may be immediately adjacent a second location of the second display panel on the fabrication substrate during photo lithography of the first display panel and the second display panel.

In another example, a method of fabricating display panels, comprises computer designing, with a layout design tool, a first display panel layout including a first set of I/O pads including a first subset of palindromic I/O pads, creating a second display panel layout that is a mirror image of the first display panel layout by flipping the first display panel layout, the second display panel layout including a second set of I/O pads including a second subset of palindromic I/O pads matching the first subset of palindromic I/O pads, positioning the first display panel layout and the second display panel layout on a same fabrication substrate, performing a photolithography process of the first display panel layout and the second display panel layout on the fabrication substrate, and fabricating the first display panel and the second display panel from the fabrication substrate after conclusion of the photolithography process.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A display device, comprising:
   a first display panel including N input/output (I/O) pads [I/O$_1$ to I/O$_N$] at a first side of the display device;
   a first chip-on-flex display driver operatively connected to the N I/O pads of the first display panel at the first side of the display device;
   a second display panel including the N I/O pads at the first side of the display device, wherein I/O$_{1+M}$ and I/O$_{N-M}$ are a same type of I/O pad for M=0 to M=P for the first display panel and the second display panel;
   a second chip-on-flex display driver, having a same configuration as the first chip-on-flex display driver, operatively connected to the N I/O pads of the second display panel at the first side of the display device;
   a hinge pivotably connecting the first display panel to the second display panel, wherein the first display panel and the second display panel have reflection symmetry about a reflection axis parallel with the hinge.

2. The display device of claim 1, wherein I/O$_{1+P+1}$ to I/O$_{N-P-1}$ are data input lines for the first display panel and the second display panel.

3. The display device of claim 1, wherein the first display panel and the second display panel further include symmetric layouts of touch transmit electrodes (Tx) and symmetric layouts of touch receive electrodes (Rx).

4. The display device of claim 3, wherein the N I/O pads are located between the symmetric layout of Tx and Rx for the first display panel and the second display panel.

5. A display device, comprising:
   a first display panel including a first set of input/output (I/O) pads at a first side of the display device, the first set of I/O pads including a first subset of palindromic I/O pads;
   a first display driver operatively connected to the first set of I/O pads at the first side of the display device;
   a second display panel including a second set of I/O pads at the first side of the display device, the second set of I/O pads including a second subset of palindromic I/O pads matching the first subset of palindromic I/O pads;
   a second display driver operatively connected to the second set of I/O pads at the first side of the display device; and a hinge pivotably connecting the first display panel to the second display panel.

6. The display device of claim 5, wherein the first display panel and the second display panel have reflection symmetry about a reflection axis parallel with the hinge such that the first subset of palindromic I/O pads and the second subset of palindromic I/O pads have reflection symmetry about the reflection axis.

7. The display device of claim 5, wherein the first display driver and the second display driver have a same configuration.

8. The display device of claim 5, wherein the first set of I/O pads further includes a first subset of data input lines between the first subset of palindromic I/O pads, and wherein the second set of I/O pads further includes a second subset of data input lines between the second subset of palindromic I/O pads.

9. The display device of claim 5, wherein the first display driver is configured to reverse a sequence of data input lines operatively connected to the first subset of data input lines.

10. The display device of claim 5, wherein the first display driver is configured to reverse a sub-pixel sequence of data input lines operatively connected to the first subset of data input lines.

11. The display device of claim 5, wherein the first display driver is a chip on flex (COF) display driver.

12. The display device of claim 5, wherein the first display driver is a chip on plastic (COP) display driver.

13. The display device of claim 5, wherein the first subset of palindromic I/O pads includes palindromic in-panel gate driver pads, palindromic power line pads, and palindromic gate/emission I/O signal pads.

14. The display device of claim 5, wherein the first display panel further includes a symmetric layout of touch transmit electrodes (Tx) and a symmetric layout of touch receive electrodes (Rx).

15. The display device of claim 14, wherein the first subset of palindromic I/O pads are located between the symmetric layout of Tx and Rx.

16. The display device of claim 5, wherein the first display panel includes a wraparound edge distal the hinge, and the second display panel includes a wraparound edge distal the hinge.

17. The display device of claim 5, wherein the first display panel includes a wraparound edge proximate the hinge, and the second display panel includes a wraparound edge proximate the hinge.

18. The display device of claim 5, wherein the first display panel and the second display panel are on a same fabrication substrate during photo lithography of the first display panel and the second display panel.

19. The display device of claim 18, wherein a first location of the first display panel on the fabrication substrate is immediately adjacent a second location of the second display panel on the fabrication substrate during photo lithography of the first display panel and the second display panel.

20. A method of fabricating display panels, comprising:
computer designing, with a layout design tool, a first display panel layout including a first set of I/O pads including a first subset of palindromic I/O pads;
creating a second display panel layout that is a mirror image of the first display panel layout by flipping the first display panel layout, the second display panel layout including a second set of I/O pads including a second subset of palindromic I/O pads matching the first subset of palindromic I/O pads;
positioning the first display panel layout and the second display panel layout on a same fabrication substrate;
performing a photolithography process of the first display panel layout and the second display panel layout on the fabrication substrate; and
fabricating the first display panel and the second display panel from the fabrication substrate after conclusion of the photolithography process.

\* \* \* \* \*